United States Patent [19]
Senda et al.

[11] Patent Number: 5,985,451
[45] Date of Patent: Nov. 16, 1999

[54] ELASTIC PRODUCT

[75] Inventors: Masanobu Senda, Inazawa; Yasuhiko Ogisu, Nagoya, both of Japan

[73] Assignee: Toyoda Gosei Co., Ltd., Aichi-ken, Japan

[21] Appl. No.: 08/819,556

[22] Filed: Mar. 17, 1997

[30] Foreign Application Priority Data

Mar. 15, 1996 [JP] Japan ................................ 8-059540

[51] Int. Cl.$^6$ ........................................................... B32B 9/00
[52] U.S. Cl. ..................... 428/408; 428/411.1; 428/457; 428/548; 428/551; 428/552; 428/698; 427/249; 427/577; 249/114.1; 249/115; 228/199
[58] Field of Search .................................. 428/408, 552, 428/457, 698, 548, 551, 699, 411.1, 913; 228/199; 249/115, 114.1; 148/537; 427/577, 249

[56] References Cited

U.S. PATENT DOCUMENTS

| | | | |
|---|---|---|---|
| 2,360,734 | 10/1944 | Smith | 277/442 |
| 3,788,654 | 1/1974 | Mandley | 277/434 |
| 4,076,262 | 2/1978 | Deventer | 277/569 |
| 4,361,596 | 11/1982 | Dukhovskoi et al. | 427/536 |
| 4,594,294 | 6/1986 | Eichen et al. | 428/552 |
| 4,791,012 | 12/1988 | D'Agostino et al. | 428/35.3 |
| 5,041,304 | 8/1991 | Kusano et al. | 427/535 |
| 5,112,025 | 5/1992 | Nakayama et al. | 249/115 |
| 5,190,807 | 3/1993 | Kimock et al. | 428/216 |
| 5,244,730 | 9/1993 | Nguyen et al. | 428/336 |
| 5,284,543 | 2/1994 | Kusano et al. | 156/272.6 |
| 5,456,406 | 10/1995 | Lemelson | 228/199 |

FOREIGN PATENT DOCUMENTS

| | | |
|---|---|---|
| 2-22338 | 1/1990 | Japan . |
| 2-60901 | 3/1990 | Japan . |

*Primary Examiner*—Deborah Jones
*Assistant Examiner*—Abraham Bahta
*Attorney, Agent, or Firm*—Pillsbury Madison & Sutro Intellectual Property Group

[57] ABSTRACT

A master brake cylinder comprises a reservoir and a cylinder for generating fluid pressure. Provided in the cylinder is a sliding piston, and mounted to front and rear ends of piston are piston cups for sealing a gap between the piston and the cylinder. The piston cups comprise a substrate made of rubber and a coating layer made of diamond-like carbon and provided on an outer peripheral surface (sliding surface) of the substrate. A surface of the coating layer constitutes a sliding surface, and so a frictional resistance thereof relative to an inner peripheral surface of the cylinder, on which the coating layer slides, is made relatively low. The coating layer can easily follow deformation of the substrate and securely adheres to the substrate.

11 Claims, 6 Drawing Sheets

ELASTIC PRODUCT

BACKGROUND OF THE INVENTION

1. Field of the Invention

The present invention relates to an elastic product provided with a substrate which comprises at least rubber or elastomer.

2. Description of the Related Art

First Prior Art

Conventionally, a master brake cylinder for vehicles, serving to convert the force applied to a brake pedal into a hydraulic pressure, comprises a reservoir for storing the brake fluid and a cylinder for generating the hydraulic pressure. Generally, a sliding piston is provided in the cylinder portion of the master cylinder. Mounted to front and rear ends of the piston are rubber piston cups for sealing a gap between the piston and the cylinder.

However, in simply fitting the rubber piston cup in the gap, a smooth operation is hard to expect because a sliding resistance is made too high. Thus, it has thus far been considered that the sliding resistance is lowered by coating a fluorine resin on the surface of the rubber substrate or by applying a fluorine plasma treatment.

Second Prior Art

Conventionally, a fuel cap is provided on a front end of a fuel pipe, that is, on an opening portion thereof for feeding a fuel such as gasoline. The fuel cap is provided with a closing sealing member for allowing the exterior and interior of the pipe to communicate to each other to discharge the gas in the pipe to the outside when a gas pressure in the fuel pipe exceeds a predetermined value. The closing sealing member is generally formed of rubber to be plate-shaped, and the biasing force of a coil spring causes the closing sealing member to constantly abut against a tubular section disposed on the pipe side so as to close a front end of the pipe. When the gas pressure in the fuel pipe exceeds the biasing force of the coil spring, the closing sealing member is separated from the above tubular section under the action of the pressure, thereby allowing the interior and the exterior of the pipe to communicate to each other. Thus, an abnormal rise in gas pressure in the pipe is suppressed.

Since there is hardly any opportunity of the closing sealing member being open, however, the closing sealing member may happen to closely adhere to the tubular section over a long-term use. In such cases, there was a fear that the closing sealing member will not open even if the gas pressure in the pipe exceeds a predetermined value. For this reason, conventionally, molybdenum disulfide (powdery substance) or the like has been applied to a surface of the closing sealing member which abuts against the tubular section in order to suppress such close adherence.

Third Prior Art

Conventionally, a capability of preventing the gas outflow of gasoline or the like (gas barrier capability) and capability of preventing the fluid outflow has been required of rubber products such as fuel hoses. For this purpose, a fluorine resin tube may be provided on the inner peripheral surface of a hose.

However, in the first prior art, while the sliding resistance can be reduced by coating a fluorine resin on the surface of a rubber substrate or by applying a fluorine plasma treatment, either case has been insufficient in wear resistance. Not to say lack of cohesive force in coating film or plasma treated film, this is believed to be attributable to lack of connecting force or adhesive force between these films and the rubber substrate.

Thus, peeling of the film from the substrate resulted in disadvantages that the sliding resistance increases and abnormal sounds accompanied by sliding generate, thereby reducing practicability.

In the second prior art described above, molybdenum disulfide or the like adhering to a surface of the closing sealing member, which abuts against the tubular section, for the suppression of close adherence is simply rubbed onto such surface, and so is deficient in durability. More specifically, molybdenum disulfide or the like is problematic in such close adherence since it falls off the closing sealing member over a long-term use. Especially, in the case where molybdenum disulfide or the like falls off, forces caused by close adherence are made large in the presence of plasticizer in rubber or impurities in gasoline, so that there is a fear of the sealing member being not open when necessary.

Furthermore, in the third prior art described above, the treatment is applicable to nearly straight fuel hoses or the like, but inapplicable to a complicated-shaped member having many curved portions or a member such as diaphragms and constant-velocity joint boots, which are forced to frequently deform. This is because a fluorine resin tube is poor in shape followability and relatively small in adhesion to the substrate. Thus, in the present circumstances, no such product satisfying the gas barrier capability or liquid outflow preventing capability has been obtained.

SUMMARY OF THE INVENTION

It is an object of the present invention to provide an elastic product enabling solving the respective disadvantages mentioned above.

Especially, it is an object of the present invention to provide an elastic product capable of fully exhibiting an excellent wear resistance when used as sliding parts. Also, it is another object of the present invention to provide an elastic product enabling preventing occurrence of disadvantages due to close adherence to a sealed member when used as a sealing part.

Furthermore, it is a further object of the present invention to provide an elastic product enabling suppressing the permeation of a fluid when used as a fluid permeation preventing member even if the product has a complicated shape or can frequently deform.

In order to achieve the objects mentioned above, the invention provides an elastic product comprising a substrate made of rubber or elastomer and a coating layer made of diamond-like carbon and provided on at least a part of a surface of the substrate.

In one aspect of the invention, the coating layer is such that surfaces thereof constitute a sliding surface.

In another aspect of the invention, the elastic product for sliding parts is arranged in a brake cylinder for vehicles and comprises piston cups for sealing a gap between the cylinder and a piston.

In further aspect of the invention, the coating layer is such that at least surfaces thereof constitute a sealing surface which abuts against a member or members being sealed.

In still another aspect of the invention, the coating layer is provided detachably on the member or members being sealed.

In still further aspect of the invention, the elastic product for sealing parts is used as a closing member in a fuel cap.

In another aspect of the invention, the coating layer serves to shut off fluid permeation through the substrate.

In further aspect of the invention, the fluid is gasoline and said substrate is a substrate for flexible fuel hoses or diaphragms.

In still another aspect of the invention, the fluid is grease and the substrate is a substrate for flexible constant-velocity joint boots.

Operation

According to the invention, a coating layer made of diamond-like carbon is provided on at least a part of a surface of the substrate made of rubber or elastomer. Thus, the following effects are obtained when used as individual parts or members.

That is, when an elastic product is used as a sliding part, a surface of a coating layer made of diamond-like carbon forms a sliding surface. Thus, a frictional resistance of the sliding surface relative to a body, on which the sliding surface slides, is made relatively low. In addition, the coating layer can easily follow deformation or the like of the substrate and moreover firmly adheres to the substrate. Thus, even after a long-term use, the coating layer will not peel off the substrate.

Especially when an elastic product for sliding parts is arranged in a brake cylinder for vehicles to be used as piston cups for sealing a gap between a cylinder and a piston, the frictional resistance between an inner peripheral surface of a cylinder and the piston cups is made small, so that the piston cups can smoothly slide. Additionally, the coating layer will not peel off the substrate even if sliding is repeated for a long period of time, so that the piston cups can endure a long-term use.

In addition, when an elastic product is used as sealing parts, at least a part of a surface of a coating layer made of diamond-like carbon forms a sealing surface which abuts against a member being sealed. Thus, elastic deformation of the substrate secures a sealing capability between the member being sealed and the sealing surface. Because of firmly adhering to the substrate, the coating layer will not fall off the substrate even after a long-term use. Here, the coating layer does not have a adhering property comparable to that of rubber. Accordingly, a sealing part (coating layer) will not adhere to the sealed member even after a long-term use.

Besides, the coating layer is provided to enable detaching from a member being sealed. In such cases, the coating layer will not adhere to the member being sealed, when detached from the sealed member, so that the coating layer can be easily detached. Especially when an elastic product for sealing parts serves as a closing member in a fuel cap, a sealing part is detached from a member being sealed, against the biasing force of biasing means if pressure in the fuel pipe becomes abnormal from a predetermined value, thereby enabling the interior and exterior of the fuel pipe to communicate to each other. Thus, disadvantages due to adherence of the sealing part can be avoided.

Furthermore, when an elastic product is used as fluid permeation preventing member, a fluid capable of permeating through the substrate is sealed off by the coating layer. Here, the coating layer can easily follow a change in shape and is firmly bonded to the substrate, so that it will neither peel off nor separate with a change in shape, and does not interfere with deformation of the substrate.

Especially when an elastic product for fluid permeation preventing members is used for flexible fuel hoses or diaphragms, permeation of gasoline as fluid can be regulated by a body, on which the coating layer is coated.

Besides, when an elastic product for fluid permeation preventing members is used for flexible constant-velocity joint boots, permeation of grease as fluid can be regulated by a body, on which the coating layer is coated.

DESCRIPTION OF THE PREFERRED EMBODIMENTS

First Embodiment

Figure 1:
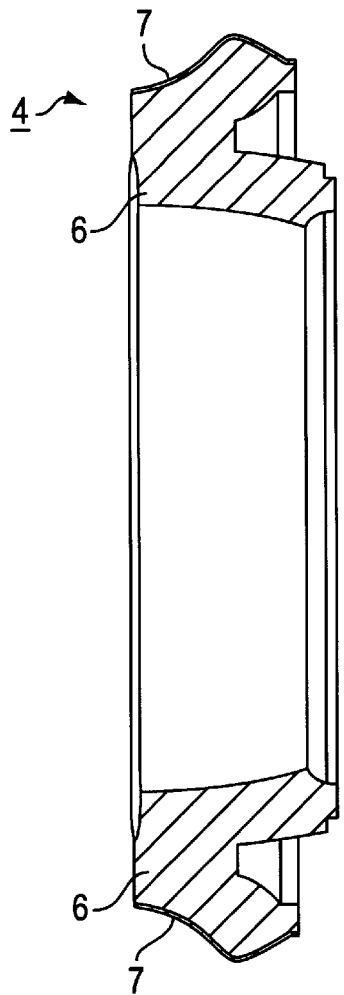
FIG. 1 is a cross sectional view of a piston cup according to a first embodiment of the invention.
Figure 2:
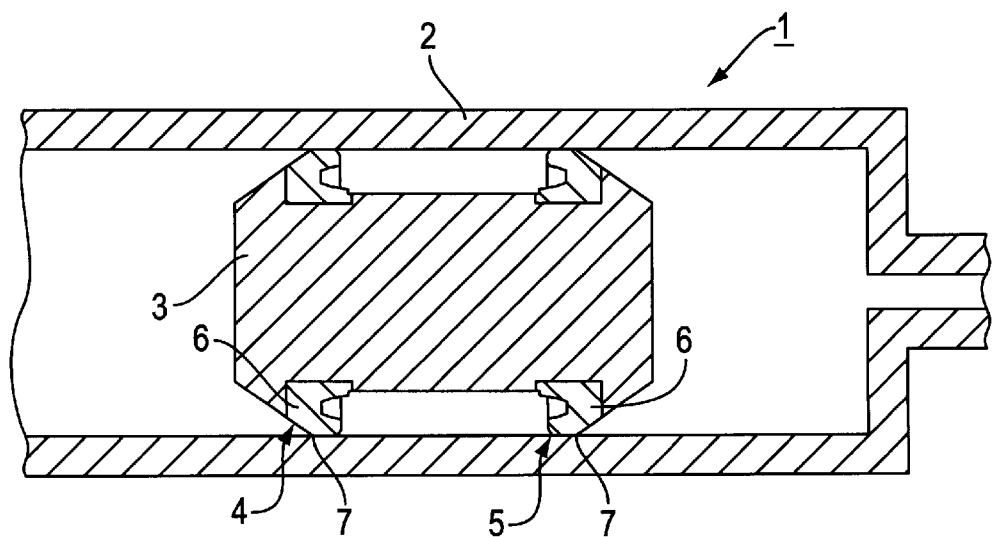
FIG. 2 is a sectional view schematically showing a construction of a master brake cylinder.

Hereinafter, a first embodiment of the invention applied to an elastic product used in a master brake cylinder for vehicles will be described referring to FIGS. 1 to 4. As shown in FIG. 2, a master brake cylinder 1 for vehicles serves to convert forces applied to a brake pedal into fluid pressure, and comprises a reservoir (not shown) for storing a brake fluid and a cylinder 2 for generating a fluid pressure. Provided in the cylinder 2 is a sliding piston 3. Mounted to front and rear ends of a piston 3 are piston cups 4, 5 which comprise elastic products and seal a gap between the piston 3 and the cylinder 2.

Since both the piston cups 4, 5 are identical to each other in shape in the embodiment, the piston cup 4 shown in the right-side of FIG. 2 will be described hereinafter. As shown in FIG. 1, the piston cup 4 comprises a substrate 6 formed of rubber, e.g., ethylene-propylenediene terpolymer methylene linkage (EPDM) and a coating layer 7 made of diamond-like carbon and provided on an outer peripheral surface (sliding surface) of the substrate 6. A film thickness of the coating layer 7 amounts to, for example, 0.05 $\mu$m–15.0 $\mu$m.

Figure 3:
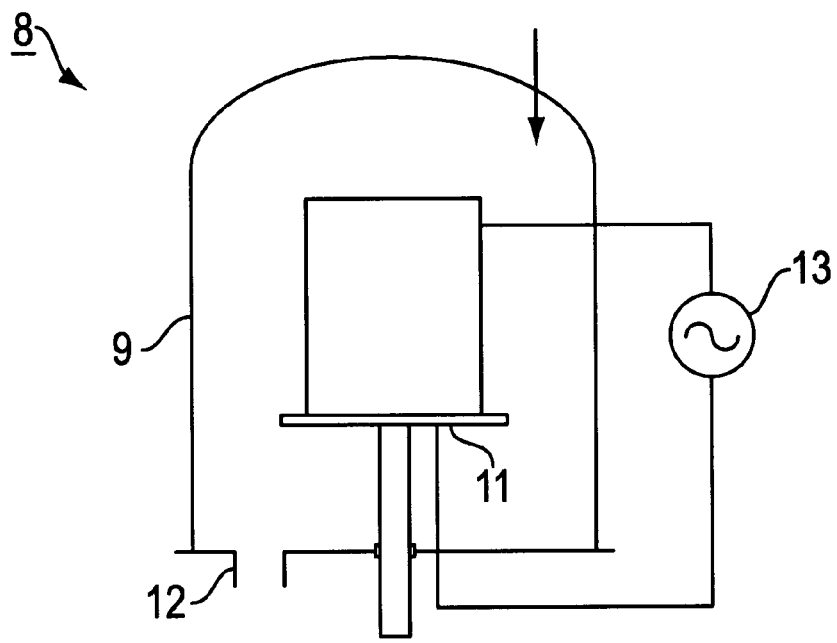
FIG. 3 is a schematical view of an apparatus for forming a coating layer.

An apparatus for forming a coating layer 7 on the substrate 6 as mentioned above will be described herein-below. In forming the coating layer 7, a coating layer forming apparatus 8 as shown in FIG. 3 is used. More specifically, the apparatus 8 comprises a furnace wall 9 and a water-cooled electrode 11 in the shape of a pedestal provided in the furnace wall 9. Provided on the furnace wall 9 is a pressure-reducing pipe 12, to which a vacuum pump (not shown) is connected. Furthermore, a raw gas such as hydrocarbon gas, preferably methane gas mentioned later is fed inside the above furnace wall 9. In addition, provided outside the furnace wall 9 is a RF power source (frequency: 13.56 MHz) 13, to which both the electrode 11 and the furnace wall 9 are connected.

Next, one example of forming a coating layer 7 made of diamond-like carbon by using the above coating layer forming apparatus 8 will be described.

First, a metal mold apparatus (not shown) is used to mold substrates 6 of piston cups 4, 5 by using EPDM and permits the same to be vulcanized. Next, in a pretreatment, a degreasing treatment of the surfaces of the substrates 6 is carried out by using acetone, isopropyl alcohol or the like.

And, the substrates 6 having been subjected to the pretreatment are placed and fixed on the above electrode 11. Next, after an interior of the furnace wall 9 is reduced in pressure to a predetermined pressure (e.g., 1 H $10^{-5}$ Torr) by means of a vacuum pump, hydrogen gas (e.g., gas pressure . . . 0.1 Torr; and flow rate . . . 50 sccm) is introduced into the furnace wall 9 for the cleaning of the surfaces of the substrates 6 and at the same time a RF power of 150 W is applied for 10 minutes to perform a plasma treatment.

Then, the introduction of hydrogen gas is interrupted, methane gas ($CH_4$) (e.g., gas pressure of 0.1 Torr; and flow rate of 50 sccm) is introduced instead into the furnace wall 9 and at the same time a RF power of 50 W is applied for an hour to perform a plasma treatment. In this manner, a coating layer 7 made of diamond-like carbon is formed on the surfaces of the substrate 6.

After the lapse of an hour, the RF power discharge alone is stopped. After cooling for a predetermined time (e.g., an hour), the interior of the furnace wall 9 is opened to the atmosphere and the substrate 6, on which a coating layer 7 is formed, is taken out from inside the furnace wall 9.

The piston cups 4, 5 obtained in this manner present the following operating effects.

(a) That is, in the piston cups 4, 5 of the embodiment, the surface of the coating layer 7 made of diamond-like carbon forms a sliding surface. Accordingly, a frictional resistance relative to an inner peripheral surface of the cylinder 2, to which the piston cups slide, becomes relatively low. Thus, the cups 4, 5 and hence the piston 3 can smoothly slide on the interior of the cylinder 2.

(b) The coating layer 7 can easily follow a deformation of the substrate 6, and moreover firmly adheres to the substrate 6. Accordingly, even if the piston cups 4, 5 are used for a long period of time, the coating layer 7 will not be peeled off from the substrate 6. As a result, an excellent wear resistance and durability can be fully exhibited.

(c) Furthermore, generation of abnormal sounds accompanying sliding movements can be suppressed.

(d) Besides, because the coating layer 7 can be formed in a relatively thin shape as compared with a conventional resin coating and the like, the substrate 6 or the like can be designed with ease.

Confirming Experiments

Subsequently, to confirm the above effects (a) and (b), the following experiments were carried out. Test pieces of EPDM are formed with the coating layer 7 (the embodiment) and test pieces of EPDM are formed with a conventional fluorine coating layer (comparative example). First, sliding resistance was measured with respect to both the test pieces. The sliding resistance was evaluated by measuring an initial resistance value when a load of 500 g is applied to a stainless steel ball of 10 mm in diameter and the ball was pulled at a speed of 150 mm/min. Table 1 shows the results of measuring sliding resistances in the respective test pieces.

TABLE 1

| Test Piece | Sliding Resistance |
| --- | --- |
| Comparative example | 0.05 |
| The embodiment | 0.05 |

As shown in Table 1, it is found that the test pieces according to the embodiment exhibit a sliding resistance equivalent to that of one with a fluorine coating layer. Thus, it can be said that, according to the embodiment, a smoothness equivalent to a case where a fluorine coating layer is formed can be ensured.

Second, a checkered tape peeling test was carried out on the respective test pieces at the initial stage and after the 180° bending. In the test, the number of sheets peeled off the substrate was expressed in numerical values when the coating layer 7 and the fluorine coating layer were divided into 100 pieces in total in a 10×10 checkered shape and actions of tape pasting and peeling were repeated 10 times. Table 2 shows the thus obtained result.

TABLE 2

| Test Piece | Number of peeled sheets (initially) | Number of peeled sheets (after the 180° bending) |
| --- | --- | --- |
| Comparative example | 9/100 | 10/100 |
| The embodiment | 0/100 | 0/100 |

As shown in Table 2, it is found that in the test piece according to the embodiment, the coating layer 7 is firmly bonded to the substrate and is hard to be peeled off even in bending deformation. It can be said from these that the piston cups 4, 5 exhibit an excellent wear resistance and durability without peeling of the coating layer 7 from the substrate 6 even if used for a long period of time.

Second Embodiment

A second embodiment of the present invention applied to an elastic product such as an closing sealing member for fuel caps will be described hereinbelow with reference to FIGS. 4 to 7. In the second embodiment, an explanation of parts equivalent to those of the first embodiment mentioned above is omitted. The following description will be carried out while centered on the differences from the first embodiment.

Figure 5:
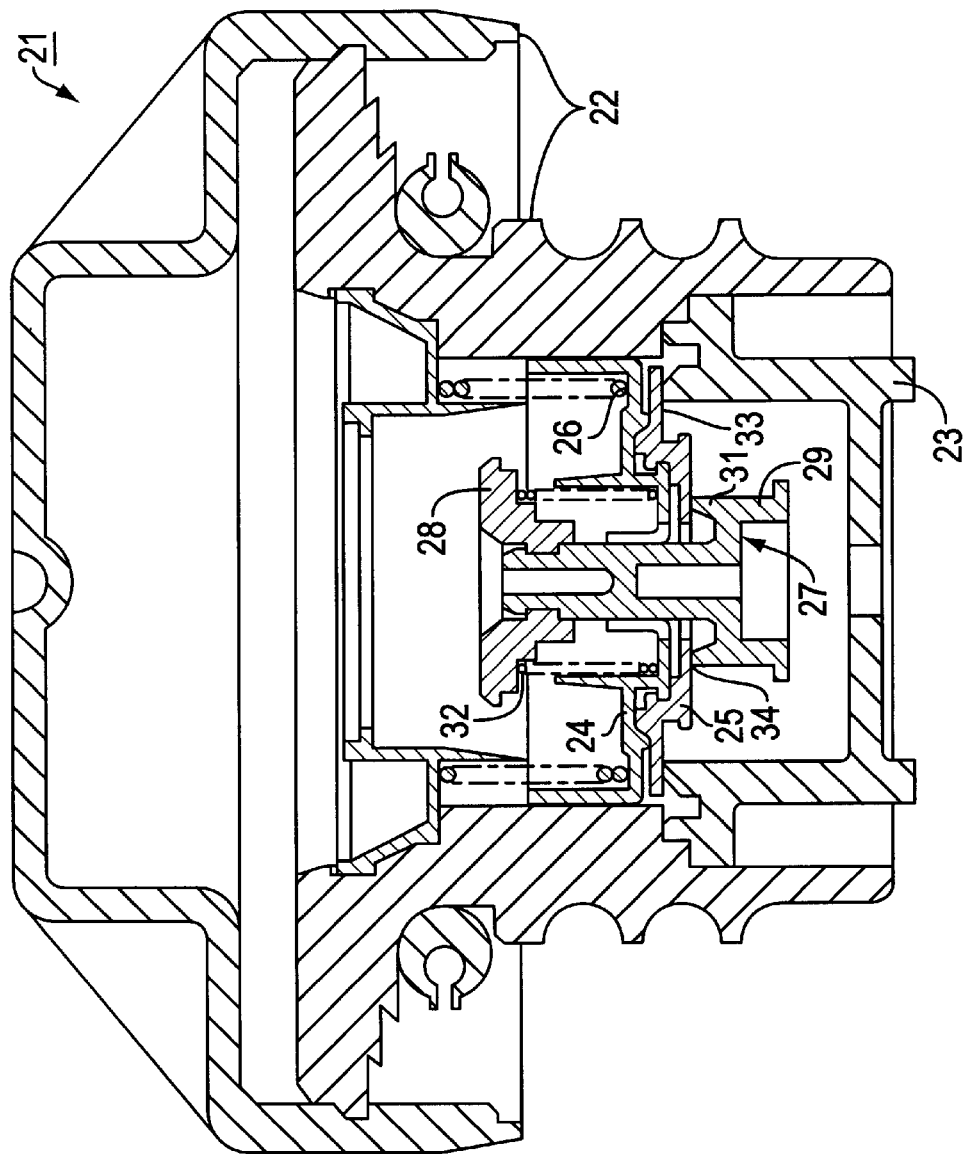
FIG. 5 is a sectional view showing a construction of a fuel cap.

As shown in FIG. 5, the fuel cap 21 is provided on an opening end of a fuel pipe (not shown). The fuel cap 21 comprises a resin cap body 22 and a tubular section 23 provided on an opening end thereof to be opposed to the opening end of the above fuel pipe. Provided between the cap body 22 and the tubular section 23 is an outer tube 24 capable of moving reciprocatingly. Provided between the outer tube 24 and the tubular section 23 is an closing sealing member 25 which is an elastic product. Furthermore, provided between the above outer tube 24 and the above cap body 22 is a first coil spring 26. The spring 26 constantly biases both the outer tube 24 and the above closing sealing member 25 toward the tubular section 23 (downward in FIG. 5), and a part of the closing sealing member 25 abuts against an edge of the tubular section 23.

Provided in the above outer tube 24 is an inner tube 27. Formed on a side of the inner tube 27 (top side of FIG. 5) toward the cap body 22 is a first large diameter section 28, and formed on a side of the inner tube 27 (bottom side of FIG. 5) toward the tubular section 23 is a second large diameter section 29. Formed integrally on a peripheral edge of the second large diameter section 29 is a projection 31 extending toward the above closing sealing member 25. Provided between the first large diameter section 28 and the above outer tube 24 is a second coil spring 32. The spring 32 constantly biases the inner tube 27 upward in FIG. 5 and the biasing force causes the projection 31 of the above second large diameter 29 to abut against the closing sealing member 25.

Thus, in the fuel cap 21 according to the embodiment, the outer tube 24 is biased by the first coil spring 26 to have the closing sealing member 25 abutting against the tubular section 23 and the inner tube 27 is pulled upward in FIG. 5 by the second coil spring 32 to have the projection 31 abutting against the closing sealing member 25, so that the fuel pipe is kept in a close state to the exterior. That is, the closing sealing member 25 has a first seal portion 33 between it and the tubular section 23, and has a second sealing portion 34 between it and the projection 31.

Figure 4:
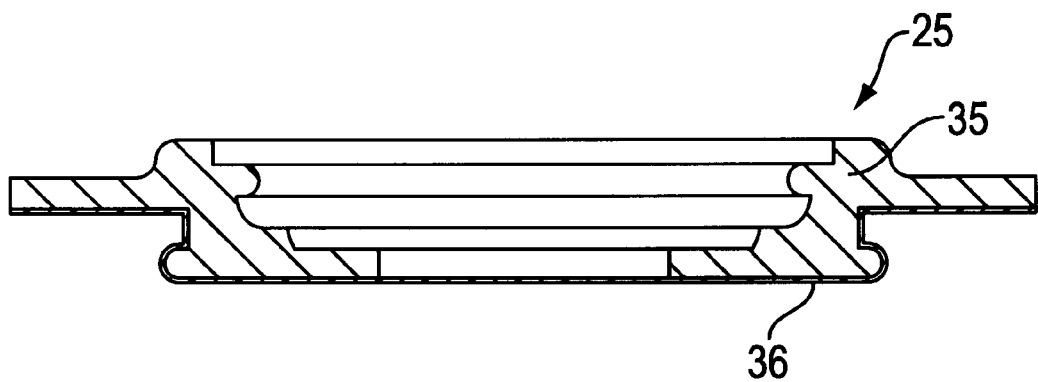
FIG. 4 is a sectional view of an closing sealing member according to a second embodiment of the invention.

Meanwhile, as shown in FIG. 4, the closing sealing member 25 in the embodiment comprises a substrate 35 made of NBR (butadiene-acrylonitrile copolymer rubber) and a coating layer 36 made of diamond-like carbon formed on sides of the substrate 35 toward the first and second sealing portions 33, 34.

An operation of the fuel cap 21 will be described hereinbelow.

Figure 6:
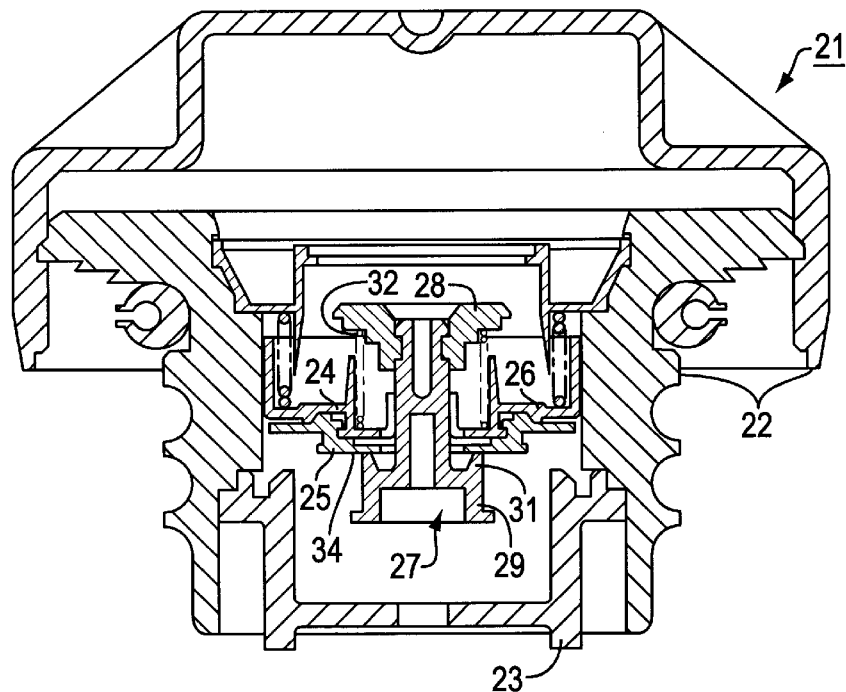
FIG. 6 is a cross sectional view showing an operation of a fuel cap.

First, when a rise in outside temperature or the like leads to an increase in pressure inside the fuel pipe and a difference between the pressure and the atmospheric pressure becomes larger than the biasing force of the first coil spring 26, the outer tube 24, inner tube 27 and closing sealing member 25 move as a unit upward as shown in FIG. 6. Such movement causes the first sealing portion 33 to open between the tubular section 23 and the closing sealing member 25, thereby permitting the pressure in the pipe to escape to outside.

Figure 7:
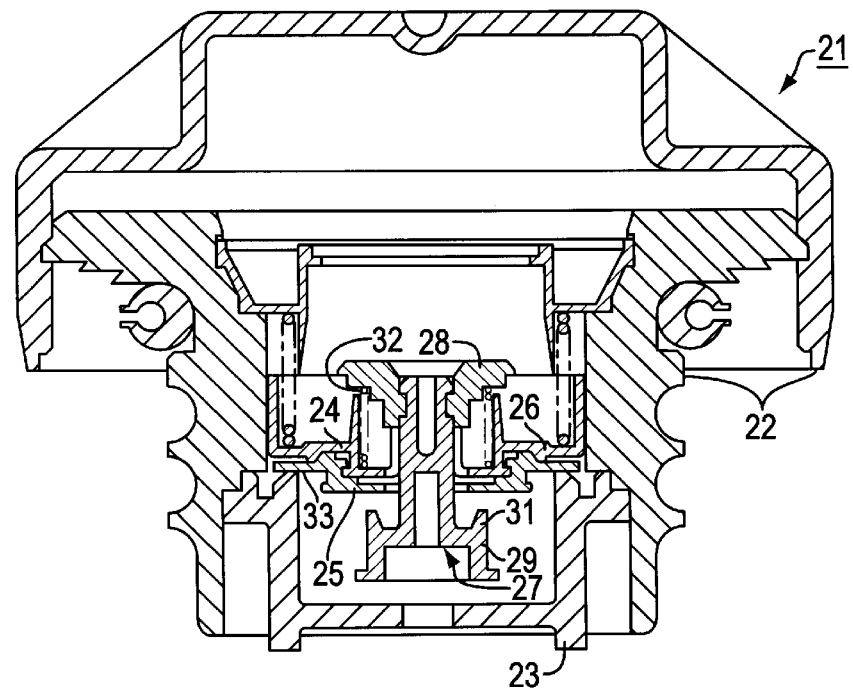
FIG. 7 is a cross sectional view showing the operation of a fuel cap.

In contrast, when the pressure in the pipe lowers and a difference between the atmospheric pressure and the above pressure becomes larger than the biasing force of the second coil spring 32, the inner tube 27 moves downward as shown in FIG. 7. Such movement causes the projection 31 of the inner tube 27 to separate from the tubular section 23 and the second sealing portion 34 to open between the tubular section 23 and the closing sealing member 25, thereby permitting the atmosphere to be introduced therethrough into the pipe.

As mentioned above, depending on the pressure difference between the interior and the exterior of the pipe, the respective sealing portions 33 and 34 of closing sealing member 25 are opened/closed. In such opening/closing, the embodiment presents the following function and effects.

(a) The portion corresponding to the first and second sealing portions 33, 34 can fundamentally ensure the sealing force between them and the tubular section 23 due to a fine deformation of the substrate 35.

(b) Especially, the portion corresponding to the first and second sealing portions 33, 34 comprises a coating layer 36 made of diamond-like carbon. Thus, the coating layer 36 firmly adheres to the substrate 35, so that it will not fall off the substrate 35 even after a long-term use.

(c) Here, the coating layer 36 does not have close adherence comparable to that of rubber. Thus, even if the closing sealing member 25 is used for a long period of time, it does not result that the coating layer 36 will adhere to the tubular portion 23. To be specific, a situation that both the first sealing portion 33 and second sealing portion 34, respectively, adhere and will not open when necessary can be surely avoided.

Confirming Experiments

Subsequently, to confirm the above effects (b) and (c), the following experiments were carried out. A test piece (the embodiment) was formed of a rubber plate of NBR, on which a coating layer 36 made of diamond-like carbon was formed, and a test piece (comparative example 1) was formed of a rubber plate of NBR without any treatment. Further, a test piece (comparative example 2) was formed of a rubber plate of NBR, on which a fluorine resin (FKM: vinylidene fluoride-hexafluoropropylene copolymer) was laminated. Then, adhering forces were measured.

In the measurement, a piece of cellophane tape was adhered to the untreated-side surface of the respective test pieces, a polyacetal resin (POM) sheet (equivalent to the tubular section 23) was placed on the respective test pieces with gasoline dipped on the treated-side surface and a pressure of 1.1 kg/cm$^2$ was applied to the respective test pieces for 6 hours. Then, a piece of cellophane tape was adhered to the polyacetal resin (POM) sheet, and both the pieces of cellophane tape were pulled in opposite directions with a tensile speed of 50 mm/min. The result is shown in Table 3.

TABLE 3

| Test Piece | Adhering Force (N/cm$^2$) |
| --- | --- |
| Comparative example 1 | 4.0 |
| Comparative example 2 | 3.5 |
| Embodiment | 0.0 (no adhering) |

As shown in Table 3, it can be said that the embodiment eliminates adherence to the resin sheet whereby opening/closing can be surely performed.

In addition, in another experiment, test pieces of the embodiment and test pieces with molybdenum disulfide rubbed onto the surface of a rubber sheet were prepared, and checkered peeling tests were carried out. In this case, the result was obtained that no test piece of the embodiment was underwent peeling in ten peeling tests, but little amount of molybdenum remained finally on the test pieces with molybdenum rubbed thereon. From these, it can be said that the embodiment has an excellent durability and can endure a long-term use.

Third Embodiment

Figure 8:
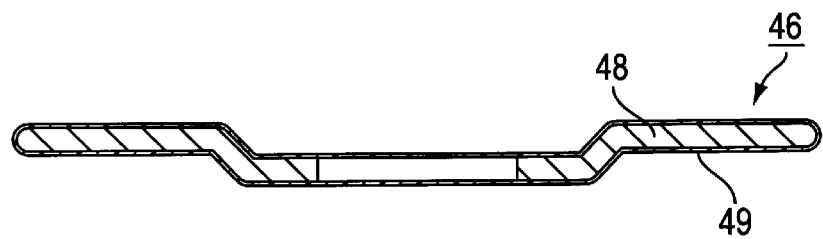
FIG. 8 is a cross sectional view of a diaphragm according to a third embodiment of the invention.

A third embodiment of the present invention applied to an elastic product such as a diaphragm for fuel pressure control valves will be described hereinbelow with reference to FIGS. 8 and 9. In the third embodiment, an explanation of parts equivalent to those of the first embodiment mentioned above is omitted. The following description will be given with respect to differences between the third embodiment and the first embodiment.

Figure 9:
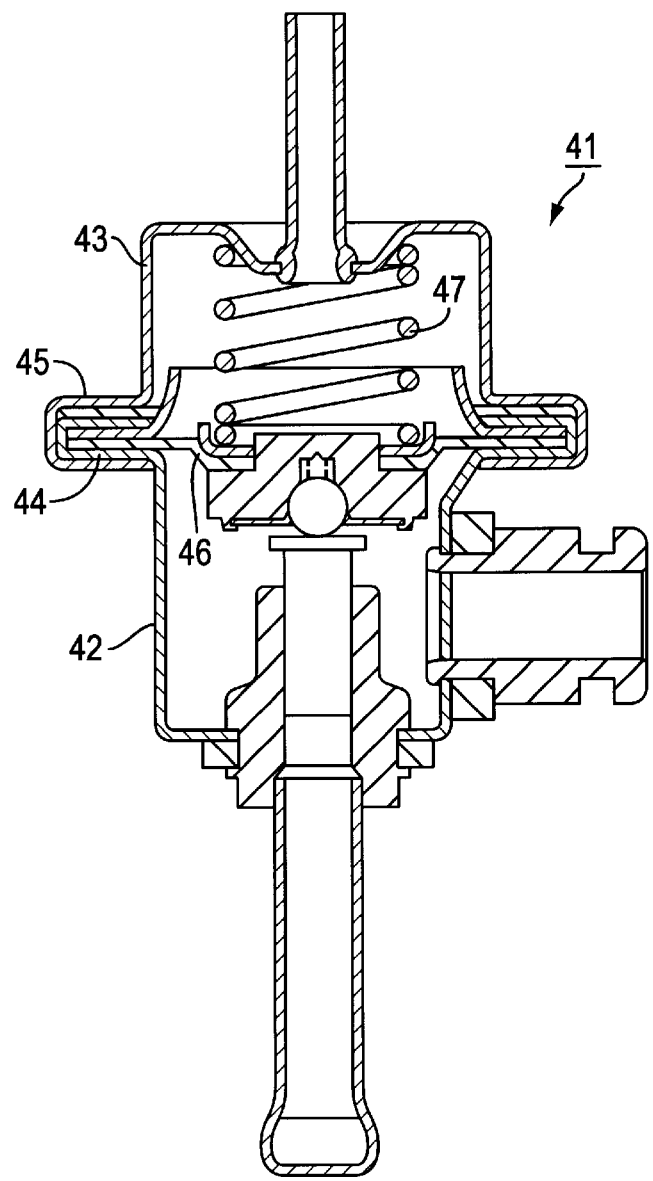
FIG. 9 is a cross sectional view showing a construction of a fuel pressure control valve.

As shown in FIG. 9, a fuel pressure control valve 41 comprises a first housing 42 and a second housing 43. Formed integrally on the respective housings 42 and 43 are flanged portions 44 and 45, and a diaphragm 46 or an elastic product is interposed between these flanged portions 44 and 45.

An internal space of the above first housing 42 defines a part of a fuel passage. On the other hand, provided in the second housing 43 is a coil spring 47 which serves to keep the diaphragm 46 in a neutral position. If there is a pressure fluctuation in the fuel passage, the pressure fluctuation is absorbed and alleviated by a displacement of the diaphragm 46, so that the fuel pressure is appropriately controlled. Incidentally, because a structure of the fuel pressure control valve 41 itself is well-known, further explanation thereof will be omitted here.

In the embodiment, the diaphragm 46 comprises a substrate 48 made of NBC or CR (Chloroprene Rubber) and a coating layer 49 made of diamond-like carbon formed on surfaces of the substrate 48.

Function and effects of the embodiment will be described hereinbelow.

(a) serving to separate a fuel passage, through which gasoline or the like passes, and an air chamber from each other, the diaphragm 46 is required to have a fuel permeation preventing capability as a matter of course. According to the embodiment, the permeation of gasoline is shut off by a coating layer 49 made of diamond-like carbon. Thus, occurrence of disadvantages due to the permeation of gasoline can be suppressed.

(b) The diaphragm 46 itself displaces to control the fuel pressure. More specifically, the diaphragm 46 may deform frequently and largely. The diaphragm 46 according to the embodiment comprises a rubber substrate 48 and a coating layer 49 made of diamond-like carbon formed on a surface of the substrate 48, while the coating layer 49 is formed to be extremely thin and excellent in shape followability. Thus, even if the diaphragm 46 deforms frequently and to a relatively large extent, its displacement will not be inhibited by the presence of the coating layer 49. As a result, deformation equivalent to that of a diaphragm composed only of rubber is secured to enable performing an effective pressure control.

(c) Furthermore, when the diaphragm 46 is deformed, the coating layer 49 is subjected to stresses, but the coating layer 49 is firmly bonded to the substrate 46 and the bonded condition can be secured for a long period of time as mentioned above. Thus, there is no possibility of the coating layer 49 being peeled off, and the diaphragm 46 is enabled to exhibit its capability for a long period of time.

Confirming Experiments

Subsequently, to confirm the above effects (a) and (b), the following experiment was carried out. A test piece (the embodiment) was formed of a rubber sheet of chloroprene rubber (CR), on which a coating layer 49 made of diamond-like carbon was formed, and a test piece without any treatment (comparative example 1) was prepared. Then, the above gasoline permeation and checkered peeling tests were carried out. The gasoline permeation was measured by a so-called cup method. The method was performed such that when gasoline was contained in a cup (vessel) of 34 mm in diameter and the cup was covered with a test piece and left under the atmosphere of 40° C., an amount of gasoline permeated was measure. Table 4 shows the results.

TABLE 4

| Test Piece | Number of peeled sheets (initially) | Number of peeled sheets (after 180° bending) | Amount of gasoline permeated (mg/cm² day) |
|---|---|---|---|
| Comparative Example 1 | — | — | 15.9 |
| The embodiment | 0/100 | 0/100 | 11.9 (11.5) |

Inside ( ): test piece after the bending test

As shown in Table 4, the coating layer 49 on the test pieces of the embodiment is firmly bonded to the substrate, is hard to be peeled off and is excellent in shape followability. Thus, even if a test piece deforms greatly, there is no fear that the coating layer 49 is peeled off or cracked. In addition, an amount of gasoline permeated does not increase.

Fourth Embodiment

A fourth embodiment of the present invention applied to an elastic product such as a equal-velocity joint boot will be described hereinbelow with reference to FIGS. 10 and 11. In the fourth embodiment, an explanation of parts equivalent to those of the third embodiment mentioned above is omitted. The following description will be given with respect to differences between the fourth embodiment and the third embodiment.

Figure 10:
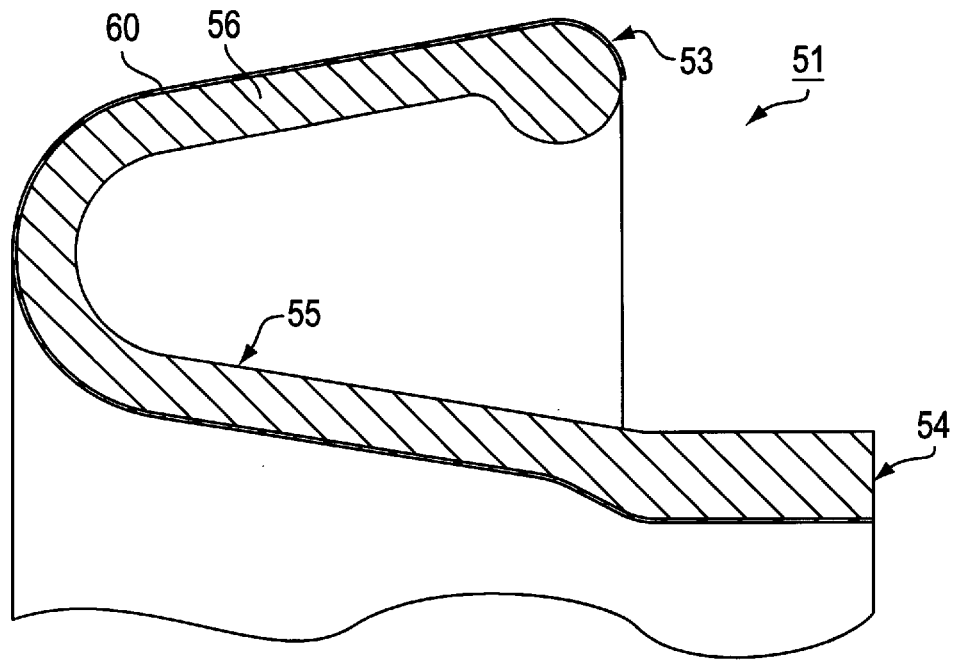
FIG. 10 is a cross sectional view of an equal-velocity joint boot according to a fourth embodiment of the invention.
Figure 11:
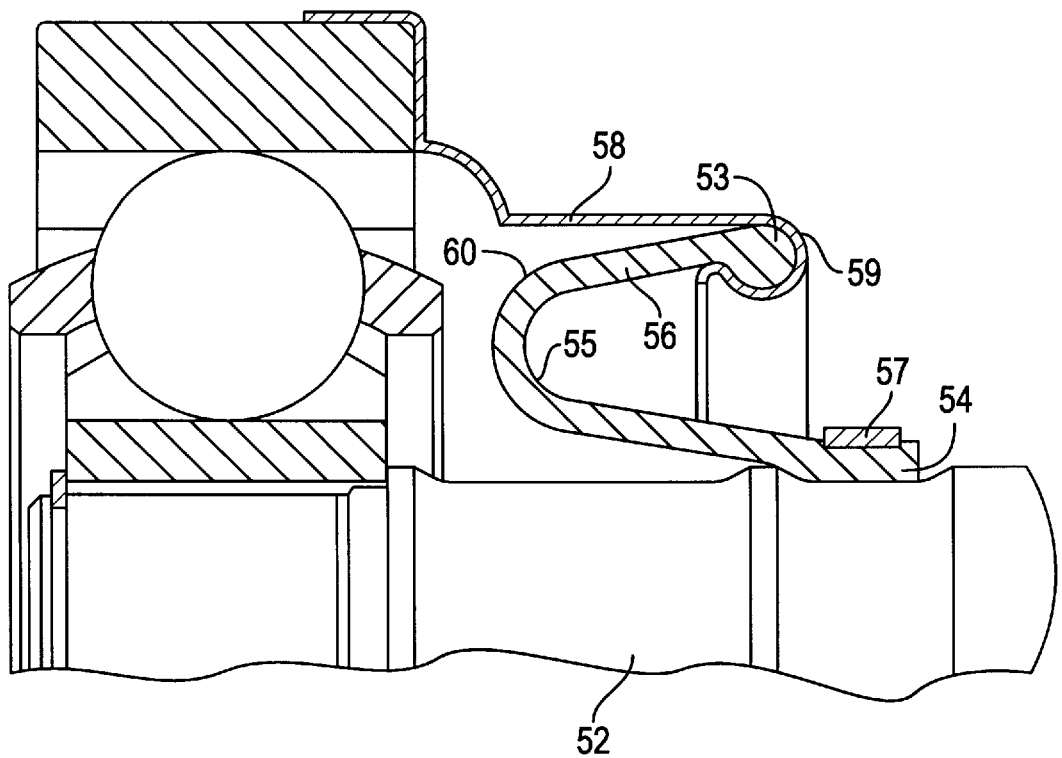
FIG. 11 is a cross sectional view showing a fitting state of the equal-velocity joint boot.

As shown in FIGS. 10 and 11, the equal-velocity joint boot 51 or an elastic product serves to cover a joint portion of a shaft 52, which may rotate at high speed, such as propeller shafts for automobiles or the like. The boot 51 mainly comprises a substrate 56 composed of a small-diameter portion 53, a large-diameter portion 54 and a coupling portion 55 for coupling them, all of which are integrally formed of rubber material (e.g., CR).

The small-diameter portion 53 is fitted near the joint portion of a propeller shaft (shaft) 52 onto an outer periphery of the shaft 52. A clamp 57 is mounted to an outer periphery of the small-diameter portion 53. Clamping of the clamp 57 causes the small-diameter portion 53 to be fixed to the shaft 52 and to be suppressed in its own movement.

A sheet metal cover 58 is attached to the shaft 52 to cover a shaft 52 with a predetermined spacing therebetween. The sheet metal cover 58 is provided on the shaft 52 to rotate therewith. In addition, the sheet metal cover 58 is bent at its one edge to form a fitting portion 59. The large-diameter portion 54 is mounted to the fitting portion 59 of the sheet metal cover 58.

Furthermore, the coupling portion 55 is so formed as to connect the small-diameter portion 53 and the large-diameter portion 54 to each other, and to be curved inward (leftward in FIG. 10). Grease is charged between the shaft 52 and the coupling portion 55.

During the use of the boot 51, the shaft 52, the sheet metal cover 58, the boot 51 and the like rotate as a unit. At this time, the boot 51 covers the joint portion of the shaft 52, which in advance prevents foreign matters from getting in from outside and grease from leaking outside.

Especially, in the embodiment, a coating layer 60 made of diamond-like carbon is provided on a side of the substrate 56 toward the shaft 52.

Also in the embodiment, function and effects equivalent to those of the third embodiment are fundamentally achieved as described below.

(a) Serving to separate the interior, in which grease is charged, and the exterior, the boot 51 is required to have a grease permeation preventing capability as a matter of course. In the embodiment, permeation of grease is shut off by the coating layer 60 made of diamond-like carbon. Thus, occurrence of disadvantages due to the permeation of grease can be suppressed.

(b) The boot 51 may deform due to a high-speed rotation of the shaft 52. The boot 51 in the embodiment comprises a rubber substrate 56 and a coating layer 60 made of diamond-like carbon and provided on a surface of the substrate 56, the coating layer 60 being formed to be extremely thin in the order of 0.05 to 15.0 μm and being excellent in shape followability. Thus, even if the boot 51 deforms frequently and to a relatively large extent, it is not hindered in displacement by the presence of the coating layer 60. As a result, deformation equivalent to that of a boot composed only of rubber is secured to enable performing an effective pressure control.

(c) Furthermore, when the boot 51 is deformed, the coating layer 60 is subjected to stresses but the coating layer 60 is firmly bonded to the substrate 56 and the bonded condition can be secured for a long period of time as mentioned above. Thus, there is no fear that the coating layer 60 is peeled off, and so the boot 51 is enabled to exhibit its own capability for a long period of time.

Incidentally, the present invention is not limited to the above-mentioned embodiments, but may be partly changed and modified within the spirit and scope thereof to be implemented as follows.

(1) In the first embodiment, the piston cups 4, 5 are mentioned as elastic products, but water closet packing and the like may constitute elastic products provided that its surface is a sliding surface.

(2) In the second embodiment, the closing sealing member 25 for a fuel cap 21 is mentioned as elastic products, but such elastic products may include a radiator cap packing and the like provided that it is provided detachably on a member being sealed.

(3) In the third and fourth embodiments, a diaphragm 46 and equal-velocity joint boot 51 are mentioned as elastic products, but such elastic products may include fuel hoses and the like provided that it is required to seal off a fluid permeable through a substrate and the substrate is flexible and is forced to deform.

(4) In the above embodiments, ethylene-propylene-diene terpolymer methylene linkage (EPDM), acrylonitrile-butadiene rubber (NBR), chloroprene rubber (CR) and the like are adopted as materials constituting the substrates 6, 35, 48 and 56, but other rubber materials such as natural rubber (NR), butadiene rubber (BR), isoprene rubber (IR) and ethylene-propylene rubber (EPR) can be also adopted. Alternatively, resin materials such as TPE (thermoplastic elastomer) can be also adopted.

As heretofore described in detail, elastic products of the present invention exhibits a superior effect of enabling demonstrating an excellent wear resistance especially when used as sliding parts.

In addition, when used as sealing parts, a superior effect of enabling preventing the occurrence of disadvantages due to adhering to a member being sealed is attained.

Furthermore, when used as fluid permeation preventing members, a superior effect of enabling preventing the permeation of a fluid even if a complicated shape or frequent deformation is involved.

What is claimed is:

1. An elastic product comprising:
    an elastic material substrate selected from the group consisting of ethylene-propylene-diene terpolymer methylene linkage (EPDM), ethylene-propylene rubber (EPR), acrylonitrile-butadiene rubber (NBR), chloroprene rubber (CR), natural rubber (NR), isoprene rubber (IR), butadiene rubber (BR) and thermoplastic elastomer (TPE); and
    diamond-like carbon coating layer provided on at least a part of a surface of said substrate so as to follow deformation of the elastic material.

2. An elastic product according to claim 1, wherein said coating layer defines a surface defining a sliding surface.

3. An elastic product according to claim 2, wherein said elastic product is a vehicular brake cylinder piston cup.

4. An elastic product according to claim 1, wherein the surface of said coating layer is a sealing surface abutting against a member or members being sealed.

5. An elastic product according to claim 4, wherein said coating layer is provided detachably on the member or members being sealed.

6. An elastic product according to claim 1, wherein said elastic product is a closing member in a fuel cap.

7. An elastic product according to claim 1, wherein said elastic product is non-permeable to fluid and wherein said coating layer serves to shut off fluid permeation through said surface.

8. An elastic product according to claim 1, wherein said product is a flexible hose.

9. An elastic product according to claim 1, wherein said product is a flexible constant-velocity joint boot.

10. An elastic product according to claim 1, wherein said product is a flexible diaphragm.

11. An elastic product according to claim 1, wherein said coating layer is directly applied to said substrate.

* * * * *